United States Patent
Kim

(10) Patent No.: US 11,392,322 B2
(45) Date of Patent: Jul. 19, 2022

(54) MEMORY SYSTEM FOR READ OPERATION AND OPERATING METHOD THEREOF

(71) Applicant: SK hynix Inc., Gyeonggi-do (KR)

(72) Inventor: Yu Mi Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 29 days.

(21) Appl. No.: 16/998,530

(22) Filed: Aug. 20, 2020

(65) Prior Publication Data

US 2021/0286556 A1    Sep. 16, 2021

(30) Foreign Application Priority Data

Mar. 11, 2020   (KR) .................. 10-2020-0030183

(51) Int. Cl.
| | |
|---|---|
| *G11C 16/26* | (2006.01) |
| *G06F 3/06* | (2006.01) |
| *G06F 11/10* | (2006.01) |
| *G11C 16/14* | (2006.01) |
| *G11C 16/04* | (2006.01) |
| *G11C 16/10* | (2006.01) |

(52) U.S. Cl.
CPC .......... *G06F 3/0659* (2013.01); *G06F 3/0604* (2013.01); *G06F 3/0679* (2013.01); *G06F 11/1076* (2013.01); *G11C 16/26* (2013.01); *G11C 16/0483* (2013.01); *G11C 16/10* (2013.01); *G11C 16/14* (2013.01)

(58) Field of Classification Search
CPC .................................................... G06F 3/0569
See application file for complete search history.

(56) References Cited

U.S. PATENT DOCUMENTS

| | | | |
|---|---|---|---|
| 2018/0342305 A1* | 11/2018 | Cha ................. | G06F 13/4068 |
| 2020/0301768 A1* | 9/2020 | Papandreou ......... | G06F 3/0619 |

FOREIGN PATENT DOCUMENTS

| | | |
|---|---|---|
| KR | 10-2017-0113863 | 10/2017 |
| KR | 10-2018-0064088 | 6/2018 |
| KR | 10-2018-0077885 | 7/2018 |

* cited by examiner

*Primary Examiner* — Min Huang
(74) *Attorney, Agent, or Firm* — IP & T Group LLP

(57) ABSTRACT

A memory system may include a memory device comprising a memory device including a plurality of nonvolatile memories, each nonvolatile memory including a plurality of blocks; and a controller configured to: perform a background read operation on a select nonvolatile memory among the plurality of nonvolatile memories using an initial read voltage; store the initial read voltage, as a history read voltage, in a history table; select the history read voltage from the history table in response to a read request from a host; and perform an initial read operation on the select nonvolatile memory using the history read voltage.

26 Claims, 8 Drawing Sheets

FIG. 5

| HISTORY TABLE | | |
|---|---|---|
| PLANE# | IRV # | FLAG |
| PLANE 1 | IRV 1 | 1 |
| PLANE 2 | IRV 2 | 1 |
| PLANE 3 | - | 0 |
| ⋮ | ⋮ | ⋮ |

FIG. 6

| BACKGROUND READ VOLTAGE TABLE | 196 |
|---|---|

| BRV 1 |
|---|
| BRV 2 |
| BRV 3 |

MEMORY SYSTEM FOR READ OPERATION AND OPERATING METHOD THEREOF

CROSS-REFERENCE TO RELATED APPLICATION

This application claims priority under 35 U.S.C. § 119 to Korean Patent Application No. 10-2020-0030183, filed on Mar. 11, 2020, which is incorporated herein by reference in its entirety.

BACKGROUND

1. Field

Embodiments of the present disclosure relate to a semiconductor device, and more particularly, to a memory system for garbage collection and an operating method thereof.

2. Discussion of the Related Art

Recently, the paradigm for the computing environment has changed to ubiquitous computing in which computer systems can be used anytime everywhere. Therefore, the use of portable electronic devices such as mobile phones, digital cameras, and notebook computers has rapidly increased. Such a portable electronic device generally uses a memory system including a memory device, such as a data storage device. The data storage device is used as a main or secondary memory device of the portable electronic device.

Since the data storage device including a nonvolatile memory device has no mechanical driving unit (e.g., a mechanical arm with a read/write head) as compared with a hard disk device, the data storage device has excellent stability and durability, fast data access rate, and low power consumption. The data storage device having such advantages may include any of a universal serial bus (USB) memory device, a memory card having various interfaces, and a solid state drive (SSD).

SUMMARY

Various embodiments are directed to an operating method of a memory system for performing a read operation and a memory system including a memory controller and a memory device for performing the method.

Also, various embodiments are directed to a memory system for previously setting, during an idle time of a memory device, an initial read voltage to be applied to a page upon execution of an initial read operation occurring right after a program operation or an erase operation, and an operating method of the memory system.

Also, various embodiments are directed to a memory system capable of improving read performance in such a manner that in order to reduce a read operation failure occurring right after a program operation or an erase operation, a dummy program operation or erase operation is performed on any one of a plurality of memory blocks when a memory device is in an idle state, a background read operation is performed using a randomly set read voltage, a passed read voltage is set as an initial read voltage when the read operation is a pass, and a read operation is performed using the initial read voltage when an external or internal read operation is subsequently performed, and an operating method of the memory system.

In an embodiment, a memory system comprising a memory device comprising a plurality of nonvolatile memories, each comprising a plurality of blocks; and a controller configured to control the memory device and a memory including a history table of multiple initial read voltages and a background read voltage table, wherein the controller: determines a new initial read voltage by performing a background read operation on a nonvolatile memory for which an initial read voltage is not set, among the plurality of nonvolatile memories, during an idle time of the memory device, and stores the new initial read voltage in the history table; and selects, in the history table, an initial read voltage corresponding to a nonvolatile memory on which an initial read operation is to be performed if a read operation is the initial read operation, when performing the read operation in response to a read request received from a host, and performs the initial read operation on the nonvolatile memory using the selected initial read voltage.

In an embodiment, an operating method of a memory system, that comprises a memory device comprising a plurality of nonvolatile memories each comprising a plurality of blocks, and a controller for controlling the memory device and a memory comprising a history table and a background read voltage table, the operating method comprising: selecting one of a plurality of background read voltages in a background read voltage table, with respect to a nonvolatile memory for which the initial read voltage has not been set, among the plurality of nonvolatile memories, during an idle time of the memory device, and performing a background read operation on the nonvolatile memory using the selected background read voltage; and setting the selected background read voltage as an initial read voltage corresponding to the nonvolatile memory when the background read operation succeeds and storing the initial read voltage in the history table.

In an embodiment, an operating method of a memory system comprising a memory device comprising a plurality of nonvolatile memories and a controller for controlling the memory device, the operating method comprising: receiving a read request and an address from a host; checking whether a read operation is an initial read operation, by checking a nonvolatile memory on which the read operation is to be performed in response to the read request based on the address; identifying a history table to determine whether an initial read voltage corresponding to the nonvolatile memory has been stored in the history table, if the read operation is the initial read operation; and performing the initial read operation on the nonvolatile memory using the initial read voltage if the initial read voltage corresponding to the nonvolatile memory is present in the history table.

In an embodiment, a memory system comprising: a memory device including a plurality of nonvolatile memories, each nonvolatile memory including a plurality of blocks; and a controller configured to: perform a background read operation on a select nonvolatile memory among the plurality of nonvolatile memories using an initial read voltage; store the initial read voltage, as a history read voltage, in a history table; select the history read voltage from the history table in response to a read request from a host; and perform an initial read operation on the select nonvolatile memory using the history read voltage.

BRIEF DESCRIPTION OF THE DRAWINGS

FIG. 5 illustrates an example of a history table in which initial read voltages IRV are stored according to an embodiment.

FIG. 6 illustrates an example of a background read voltage table including background read voltages BRV to be applied in a background read operation according to an embodiment.

DETAILED DESCRIPTION

Figure 1:
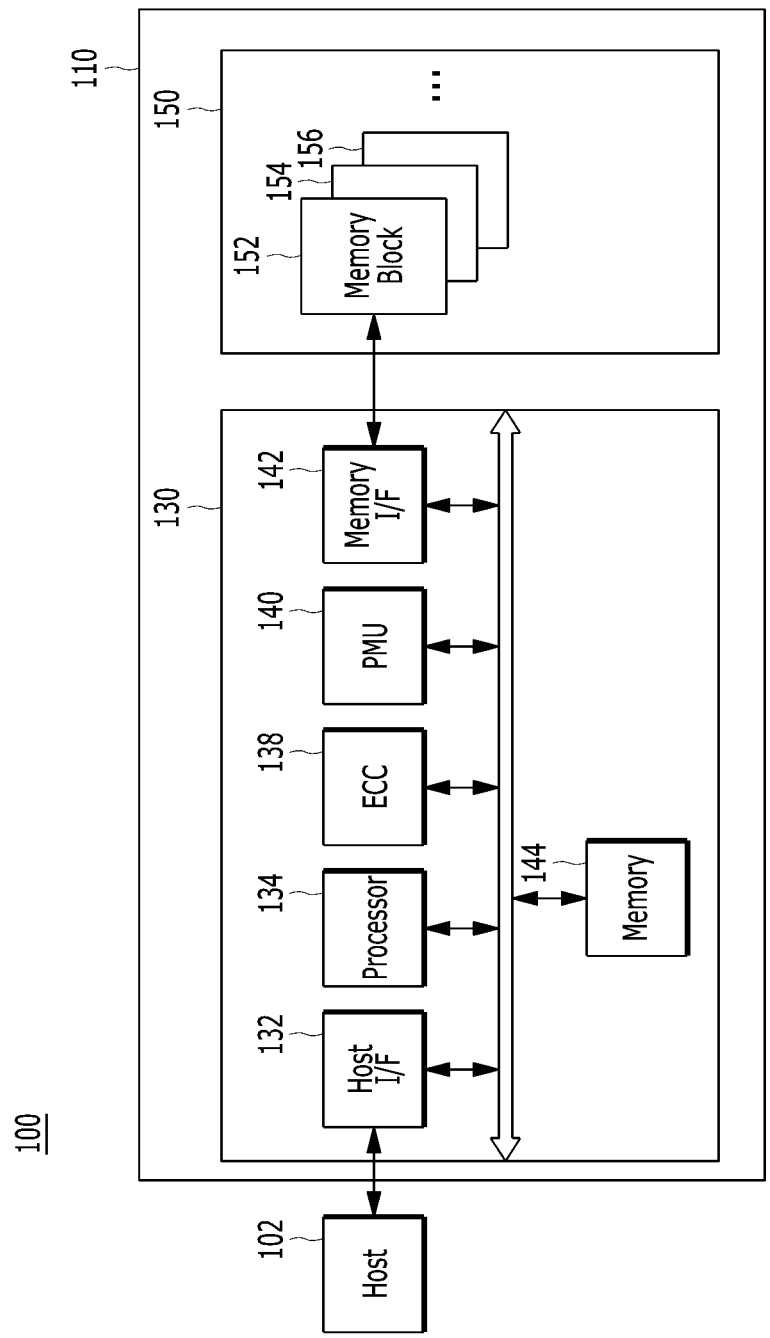
FIG. 1 is a block diagram illustrating a data processing system 100 including a memory system in accordance with an embodiment.

Various embodiments are described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present disclosure. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

FIG. 1 is a block diagram illustrating a data processing system 100 including a memory system in accordance with an embodiment.

Referring to FIG. 1, the data processing system 100 may include a host 102 and a memory system 110.

The host 102 may be realized by any of a wide variety of electronic devices, for example, portable electronic devices such as a mobile phone, an MP3 player and a laptop computer or electronic devices such as a desktop computer, a game machine, a television (TV) and a projector, that is, wired and wireless electronic devices.

Also, the host 102 includes at least one operating system (OS). The operating system generally manages and controls the functions and operations of the host 102, and provides interoperability between the host 102 and a user using the data processing system 100 or the memory system 110. The operating system supports functions and operations corresponding to the purpose and use of the operating system. For example, the operating system may be a general operating system or a mobile operating system depending on the mobility of the host 102. The general operating system may be a personal operating system or an enterprise operating system depending on the user's usage environment. For example, the personal operating system configured to support a service providing function for a general user may include Windows and Chrome, and the enterprise operating system configured to secure and support high performance may include Windows server, Linux and Unix. The mobile operating system configured to support a mobility service providing function and a system power saving function to users may include Android, iOS, Windows mobile, etc. The host 102 may include a plurality of operating systems, and executes the operating systems to perform operations with the memory system 110 in correspondence to a user request. The host 102 transmits a plurality of commands corresponding to a user request to the memory system 110, and accordingly, the memory system 110 performs operations corresponding to the commands, that is, operations corresponding to the user request.

The memory system 110 operates in response to a request of the host 102, and, in particular, stores data to be accessed by the host 102. In other words, the memory system 110 may be used as a main memory device or an auxiliary memory device of the host 102.

The memory system 110 may be implemented as any of various kinds of storage devices, depending on a host interface protocol which is coupled with the host 102. For example, the memory system 110 may be implemented as any of a solid state driver (SSD), a multimedia card (e.g., an MMC, an embedded MMC (eMMC), a reduced size MMC (RS-MMC) and a micro-MMC), a secure digital card (e.g., an SD, a mini-SD and a micro-SD), a universal serial bus (USB) storage device, a universal flash storage (UFS) device, a compact flash (CF) card, a smart media card, and a memory stick.

The storage device(s) which implement the memory system 110 may be a volatile memory device such as a dynamic random access memory (DRAM) and/or a static random access memory (SRAM) or a nonvolatile memory device such as a read only memory (ROM), a mask ROM (MROM), a programmable ROM (PROM), an erasable programmable ROM (EPROM), an electrically erasable and programmable ROM (EEPROM), an ferroelectric random access memory (FRAM), a phase change RAM (PRAM), a magnetic RAM (MRAM) and/or a resistive RAM (RRAM).

The memory system 110 includes a memory device 150 which stores data to be accessed by the host 102, and a controller 130 which controls storage of data in the memory device 150.

The controller 130 and the memory device 150 may be integrated into one semiconductor device. For instance, the controller 130 and the memory device 150 may be integrated into one semiconductor device and configure a solid state drive (SSD). In the case where the memory system 110 is used as an SSD, the operating speed of the host 102 which is coupled to the memory system 110 may be improved. The controller 130 and the memory device 150 may be integrated into one semiconductor device to form a memory card, such as a personal computer memory card international association (PCMCIA) card, a compact flash (CF) card, a smart media card (e.g., an SM and an SMC), a memory stick, a multimedia card (e.g., an MMC, an RS-MMC and a micro-MMC), a secure digital card (e.g., an SD, a mini-SD, a micro-SD and an SDHC), and/or a universal flash storage (UFS) device.

In another embodiment, the memory system 110 may be disposed in a computer, an ultra mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various component elements configuring a computing system.

The memory device 150 may retain stored data even though power is not supplied. In particular, the memory device 150 stores the data provided from the host 102 through a write operation, and provides stored data to the host 102 through a read operation. The memory device 150 includes a plurality of memory blocks 152, 154 and 156, each of which includes a plurality of pages. Each of the pages includes a plurality of memory cells to which a plurality of word lines (WL) are coupled. Also, the memory device 150 includes a plurality of planes, each of which includes a plurality of memory blocks, e.g., blocks 152, 154 and 156. In particular, the memory device 150 may include a plurality of memory dies, each of which includes a plurality of planes. The memory device 150 may be a nonvolatile memory device, for example, a flash memory. The flash memory may have a three-dimensional (3D) stack structure.

Detailed description of the structure of the memory device 150 including the 3D stack structure is given below with reference to FIGS. 2 to 4.

The controller 130 controls the memory device 150 in response to a request from the host 102. For example, the controller 130 provides the data read from the memory device 150 to the host 102, and stores the data provided from the host 102 in the memory device 150. To this end, the controller 130 controls the operations of the memory device 150, such as read, write, program and erase operations.

The controller 130 includes a host interface (I/F) 132, a processor 134, an error correction code (ECC) component 138, a power management unit (PMU) 140, a memory interface (I/F) 142 and a memory 144.

The host interface 132 processes the commands and data of the host 102, and may be configured to communicate with the host 102 through at least one of various interface protocols, such as universal serial bus (USB), multimedia card (MMC), peripheral component interconnect express (PCI-e or PCIe), serial attached SCSI (SAS), serial advanced technology attachment (SATA), parallel advanced technology attachment (PATA), small computer system interface (SCSI), enhanced small disk interface (ESDI), integrated drive electronics (IDE) and/or mobile industry processor interface (MIPI). The host interface 32 may be driven through firmware referred to as a host interface layer (HIL), which is a region which exchanges data with the host 102.

The ECC component 138 corrects error bit(s) of the data processed in the memory device 150, and may include an ECC encoder and an ECC decoder. The ECC encoder may encode data to be programmed in the memory device 150 and generate data added with parity bits. The data to which parity bits are added may be stored in the memory device 150. The ECC decoder detects and corrects an error in the data read from the memory device 150. That is to say, after performing error correction decoding for the data read from the memory device 150, the ECC component 138 may determine whether the error correction decoding has succeeded, output a signal indicative of the determined result, for example, an error correction success/failure signal, and correct error bit(s) of the read data by using the parity bits generated in the ECC encoding process. The ECC component 138 may be unable to correct error bits when the number of error bits is above a correctable error bit limit, and may output an error correction fail signal indicating that it is incapable of correcting the error bits.

The ECC component 138 may perform error correction by using various codes, which include, but are not limited to, a low density parity check (LDPC) code, a Bose, Chaudhuri, Hocquenghem (BCH) code, a turbo code, a Reed-Solomon (RS) code, a convolution code, a recursive systematic code (RSC), trellis-coded modulation (TCM) or Block coded modulation (BCM). The ECC component 138 may include any and all circuits, modules, systems or devices for suitable error correction.

The PMU 140 provides and manages power for the controller 130, that is, power for the component elements included in the controller 130.

The memory interface 142 serves as a memory and storage interface, which performs interfacing between the controller 130 and the memory device 150, to allow the controller 130 to control the memory device 150 in response to a request from the host 102. The memory interface 142 generates control signals for the memory device 150 and processes data according to the control of the processor 134, functioning as a NAND flash controller (NFC) in the case where the memory device 150 is a flash memory, in particular, a NAND flash memory. The memory interface 142 may support the operation of an interface which processes a command and data between the controller 130 and the memory device 150, for example, a NAND flash interface, in particular, data input/output between the controller 130 and the memory device 150. The memory interface 142 may be driven through firmware referred to as a flash interface layer (FIL), which is a region which exchanges data with the memory device 150.

The memory 144, as the working memory of the memory system 110 and the controller 130, stores data for driving of the memory system 110 and the controller 130. For example, when the controller 130 controls the memory device 150 in response to a request from the host 102, the controller 130 may provide data read from the memory device 150 to the host 102, and/or store data provided from the host 102 in the memory device 150. To this end, when the controller 130 controls the operations of the memory device 150, such as read, write, program and erase operations, the memory 144 stores data needed to allow such operations to be performed by the memory system 110, that is, between the controller 130 and the memory device 150.

The memory 144 may be realized by a volatile memory. For example, the memory 144 may be realized by a static random access memory (SRAM) or a dynamic random access memory (DRAM). Furthermore, the memory 144 may disposed within the controller 130 as shown in FIG. 1. Alternatively, the memory 144 may external to the controller 130, and in this regard, may be realized as a separate external volatile memory in communication with the controller 130 through a memory interface.

As described above, the memory 144 stores data needed to perform data read and write operations between the host 102 and the memory device 150 and data when performing the data read and write operations. For such data storage, the memory 144 includes one or more of a program memory, a data memory, a write buffer/cache, a read buffer/cache, a data buffer/cache, a map buffer/cache, and the like.

The processor 134 controls all operations of the memory system 110, and in particular, controls a program operation or a read operation for the memory device 150, in response to a write request or a read request from the host 102. The processor 134 drives firmware referred to as a flash translation layer (FTL), to control the general operations of the memory system 110. The processor 134 may be realized by a microprocessor or a central processing unit (CPU).

For instance, the controller 130 performs an operation requested from the host 102, in the memory device 150, that is, performs a command operation corresponding to a command received from the host 102, with the memory device 150, through the processor 134. The controller 130 may perform a foreground operation as a command operation corresponding to a command received from the host 102, for example, a program operation corresponding to a write command, a read operation corresponding to a read command, an erase operation corresponding to an erase command or a parameter set operation corresponding to a set parameter command or a set feature command as a set command.

The controller 130 may also perform a background operation for the memory device 150 through the processor 134. The background operation for the memory device 150 includes an operation of copying the data stored in one memory block, among the memory blocks 152, 154 and 156 of the memory device 150, to another memory block. Such a background operation may be a garbage collection (GC) operation, an operation of swapping data among the memory blocks 152, 154 and 156, e.g., a wear leveling (WL) operation, an operation of storing map data stored in the controller 130 in the memory blocks 152, 154 and 156, e.g., a map flush operation, or an operation of performing bad block management for the memory device 150, for example, an operation of identifying and processing a bad block among the memory blocks 152, 154 and 156 in the memory device 150.

A management unit (not shown) for performing bad block management for the memory device 150 may be included in the processor 134 of the controller 130. The management unit identifies a bad block among the plurality of memory blocks 152, 154 and 156 in the memory device 150, and then, performs bad block management of processing the bad block and labeling it as bad. The bad block management, in the case where the memory device 150 is a flash memory, for example, a NAND flash memory, is used when a program fail may occur when performing data write, for example, data program, due to the characteristic of the NAND flash memory. A memory block where the program fail has occurred is processed and labeled as a bad block, and program-failed data are written, that is, programmed, in a new memory block. Moreover, in the case where the memory device 150 has a 3-dimensional stack structure as described above, if a corresponding block is processed as a bad block according to a program fail, because the utilization efficiency of the memory device 150 and the reliability of the memory system 110 may deteriorate abruptly, it is necessary to reliably perform bad block management. A memory device in the memory system in accordance with embodiments of the present disclosure is described below in detail with reference to FIGS. 3 to 8.

Figure 2:
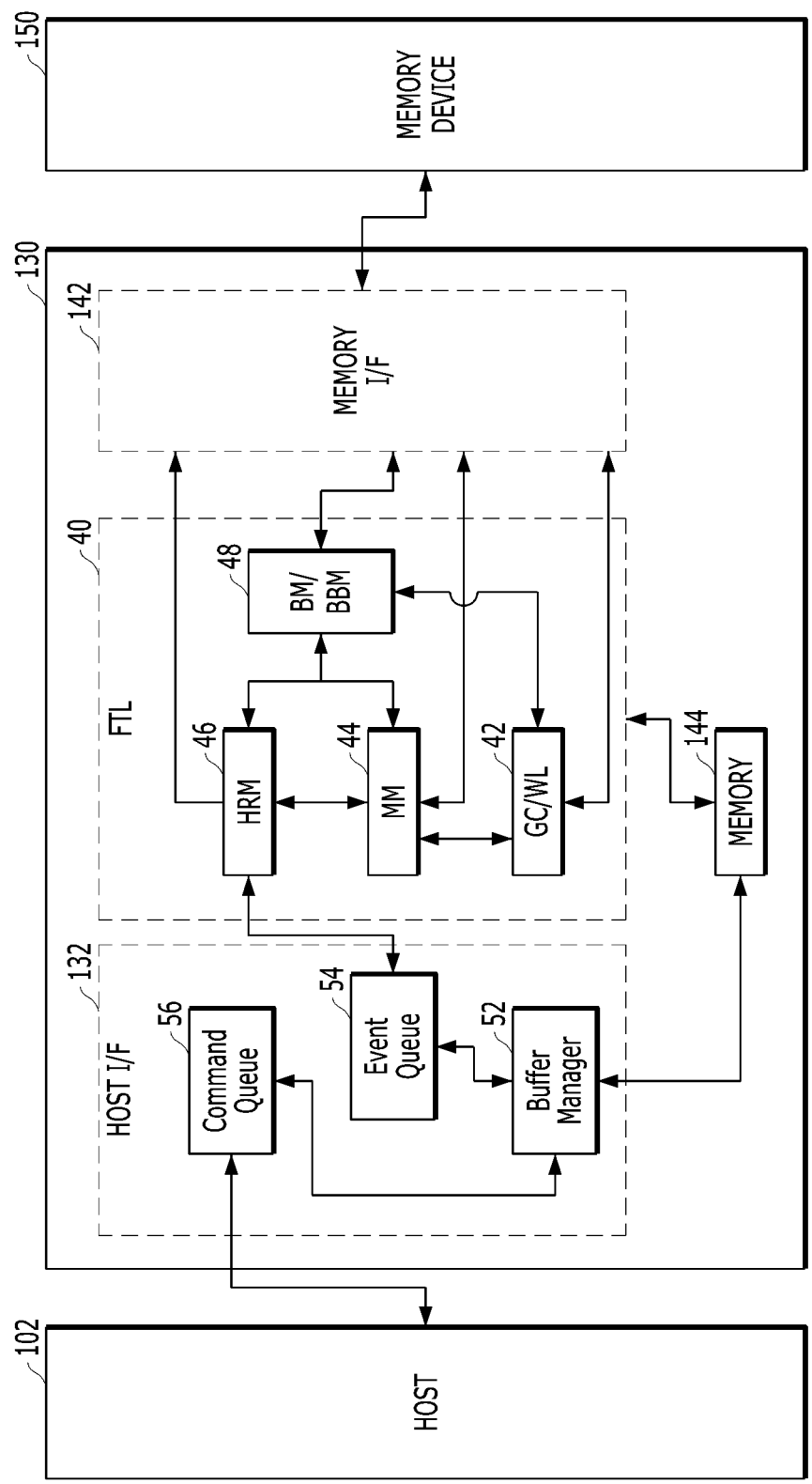
FIG. 2 illustrates a memory system according to an embodiment of the present disclosure.

FIG. 2 illustrates a memory system according to an embodiment of the present disclosure. Referring to FIG. 2, the memory system includes a controller 130 and a memory device 150. The controller 130 cooperates with a host 102 and the memory device 150. The controller 130 may include a host interface (I/F) 132, flash translation layer (FTL) circuitry 40, a memory interface (I/F) 142, and a memory 144.

The host interface 132 may handle commands and data from the host 102. By way of example but not limitation, the host interface 132 may include a command queue 56, a buffer manager 52 and an event queue 54. The command queue 56 may sequentially store commands and data from the host 102 and output them to the buffer manager 52 in the order in which they were stored. The buffer manager 52 may classify, manage, or adjust the commands and the data, which are delivered from the command queue 56. The event queue 54 may sequentially transmit events for processing the commands and the data received from the buffer manager 52.

A plurality of commands or data of the same characteristic or type may be received from the host 102, or commands and data of different characteristics (or types) may be transmitted to the memory system after being mixed or jumbled. For example, a plurality of commands for reading data (i.e., read commands) may be delivered, or read commands and program/write commands may be alternately transmitted to the memory system. The host interface 132 may store commands and data, which are received from the host 102, to the command queue 56 sequentially, that is, in the order received. Thereafter, the host interface 132 may estimate or predict what kind of internal operation the controller 130 will perform according to the characteristics, e.g., type, of the command and data, which is received from the host 102. The host interface 132 may determine a processing order and a priority of commands and data based at least on their characteristics. According to characteristics of commands and data, from the host 102, the buffer manager 52 in the host interface 132 is configured to determine whether the buffer manager 52 should store commands and data in the memory 144, or whether the buffer manager 52 should deliver the commands and the data to the flash translation layer (FTL) circuitry 40. The event queue 54 receives events, entered from the buffer manager 52, which are to be internally executed and processed by the memory system or the controller 130 in response to the commands and the data from the host 102, so as to deliver the events into the flash translation layer (FTL) circuitry 40 in the order received.

In accordance with an embodiment, the flash translation layer (FTL) circuitry 40 may include a state manager (GC/WL) 42, a map manager (MM) 44, a host request manager (HRM) 46, and a block manager (BM/BBM) 48. The host request manager 46 may manage the events entered from the event queue 54. The map manager 44 may handle or control map data. The state manager 42 may perform garbage collection (GC) or wear leveling (WL). The block manager 48 may execute commands or instructions on a block in the memory device 150.

Furthermore, according to an embodiment, the flash translation layer (FTL) 240 may function as a background initial read circuitry 190 and a normal read circuitry 192 to be described with reference to FIG. 4.

By way of example but not limitation, the host request manager 46 may use the map manager 44 and the block manager 48 to handle or process requests according to the read and program commands, and events which are delivered from the host interface 132. The host request manager 46 may send an inquiry or request to the map data manager 44, to determine a physical address corresponding to the logical address which is entered with the events. The host request manager 46 may send a read request with the physical address to the memory interface 142, to process the read request (i.e., handle the events). On the other hand, the host request manager 46 may send a program request (or write request) to the block manager 48, to program entered data to an empty page (i.e., a page having no data) in the memory device 150, and then, may transmit a map update request corresponding to the program request to the map manager 44, thereby updating mapping addresses.

Here, the block manager 48 may convert a program request delivered from the host request manager 46, the map data manager 44, and/or the state manager 42 into a flash program request used for the memory device 150, to manage flash blocks in the memory device 150. In order to enhance program or write performance of the memory system, the block manager 48 may collect program requests and send flash program requests for multiple-plane and one-shot program operations to the memory interface 142. The block manager 48 may send several flash program requests to the memory interface 142 to enhance parallel processing of the multi-channel and multi-directional flash controller.

The block manager 48 may be configured to manage blocks in the memory device 150 according to the number of valid pages, select and erase blocks having no valid pages when a free block is needed, and select a block including the least number of valid pages when it is determined that garbage collection is necessary. The state manager 42 may perform garbage collection to move the valid data to an empty block and erase remaining data in the blocks from which the valid data was moved so that the block manager 48 may have enough free blocks (i.e., empty blocks with no data). If the block manager 48 provides information regarding a block to be erased to the state manager 42, the state manager 42 is able to check all flash pages of the block to be erased to determine whether each page is valid.

For example, to determine validity of each page, the state manager 42 may identify a logical address stored in an out-of-band (OOB) area of each page. To determine whether each page is valid or not, the state manager 42 may compare the physical address of the page with the physical address mapped to the logical address obtained from the request. The state manager 42 sends a program request to the block manager 48 for each valid page. A mapping table may be updated through the update of the map manager 44 when the program operation is complete.

The map manager 44 may manage a logical-to-physical mapping table. The map manager 44 may process requests such as queries and updates, which are generated by the host request manager 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request may be sent to the block manager 48 so that a clean cache block is made and the dirty map table may be stored in the memory device 150.

When garbage collection is performed, the state manager 42 copies valid page(s) into a free block, and the host request manager 46 may program the latest version of the data for the same logical address of the page and currently issue an update request. When the state manager 42 requests the map update in a state in which copying of valid page(s) has not been completed, the map manager 44 may not perform the mapping table update. This is because the map request is issued with old physical information if the state manger 42 requests a map update and a valid page copy is not completed until later. The map manager 44 may perform a map update operation to ensure accuracy only if the latest map table still points to the old physical address.

According to an embodiment, at least one of the state manager 42, the map manager 44 and the block manager 48 may include a garbage collection module (GCM) and a map data manager (not shown). For example, at least one of the state manager 42, the map manager 44 and the block manager 48 may perform a background operation even though there is no command to do so transmitted from the host interface 132.

The memory interface 142 may serve as an interface for handling commands and data transferred between the controller 130 and the memory device 150 in order to allow the controller 130 to control the memory device 150 in response to a request delivered from the host 102. The memory interface 142 may generate a control signal for the memory device 150 and may process write data to be written in the memory device 150 or read data outputted from the memory device 150 under the control of the processor 134 when the memory device 150 is a flash memory, in particular, when the memory device 150 is a NAND flash memory. The memory interface 142 may provide operations of a NAND flash interface between the controller 130 and the memory device 150. In accordance with an embodiment, the memory interface 142 may be implemented with firmware called a flash interface layer (FIL) as a component for exchanging data with the memory device 150.

The memory device 150 may include a plurality of memory blocks. Each of the plurality of memory blocks may be a single level cell (SLC) memory block or a multi-level cell (MLC) memory block, according to the number of bits that can be stored or represented in one memory cell of such block. Here, the SLC memory block includes a plurality of pages implemented by memory cells, each storing one bit of data. The SLC memory block can have high data I/O operation performance and high durability. The MLC memory block includes a plurality of pages implemented by memory cells, each storing multi-bit data (e.g., two bits or more). The MLC memory block can have a larger storage capacity for the same space compared to the SLC memory block. The MLC memory block can be highly integrated in terms of storage capacity. In an embodiment, the memory device 150 may be implemented with MLC memory blocks, such as a double level cell memory block, a triple level cell (TLC) memory block, a quadruple level cell (QLC) memory block or a combination thereof. The double level memory block may include a plurality of pages implemented by memory cells, each capable of storing 2-bit data. The triple level cell (TLC) memory block may include a plurality of pages implemented by memory cells, each capable of storing 3-bit data. The quadruple level cell (QLC) memory block may include a plurality of pages implemented by memory cells, each capable of storing 4-bit data. In another embodiment, the memory device 150 may be implemented with a block including a plurality of pages implemented by memory cells, each capable of storing 5-bit or more bit data.

In an embodiment of the present disclosure, the memory device 150 is a nonvolatile memory such as a flash memory that is a NAND flash memory, a NOR flash memory, or the like. In another embodiment, the memory device 150 may be at least one of a phase change random access memory (PCRAM), a ferroelectrics random access memory (FRAM), a spin injection magnetic memory (e.g., a spin transfer torque magnetic random access memory (STT-MRAM)), and the like.

Figure 3:
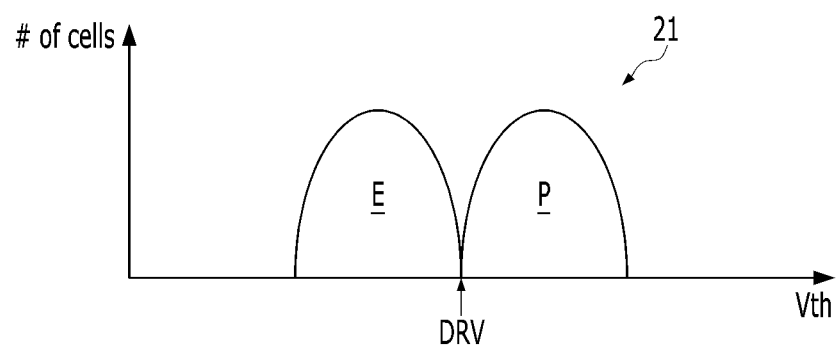
FIG. 3 illustrates an example of a change in the distribution according to the deterioration in memory cells included in a nonvolatile memory.
Figure 3:
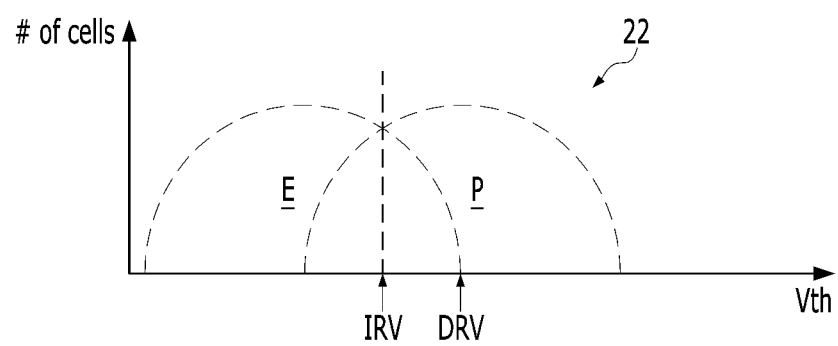

FIG. 3 illustrates an example of a change in the distribution according to the deterioration in memory cells included in a nonvolatile memory.

Referring to FIG. 3, in an initial distribution 21 and a changed distribution 22, a horizontal axis indicates a threshold voltage Vth, and a vertical axis indicates the number of memory cells. For example, if a memory cell is a single level cell programmed with 1 bit, the memory cell may have an erase state E and a program state P. The initial distribution 21 may be within a given time after memory cells are completely programmed. The memory device 150 may use a default read voltage DRV in order to identify the program state P. Thereafter, if a program operation or an erase operation is performed on adjacent memory cells (i.e., memory cells adjacent to the memory cells that has been programmed), a distribution of the default read voltages of the memory cells may temporarily deteriorate like the changed distribution 22 due to stress from the adjacent memory cells. The changed distribution 22 may be a distribution in which memory cells temporarily deteriorate after the program operation or the erase operation is completely performed on adjacent memory cells. If a program operation or an erase operation is performed on memory cells, adjacent memory cells may temporarily deteriorate due to stress. A distribution of the threshold voltages of the deteriorating memory cells may be changed from the initial distribution 21 to the changed distribution 22. Specifically, if retention time is increased, charges stored in the charge storage layers of memory cells may leak into a substrate. Accordingly, the threshold voltages of the memory cells may be decreased. If an initial read operation is performed on the deteriorating memory cells using the default read voltage DRV, a read error may temporarily occur in some of memory cells programmed in the program state P. In this case, the initial read operation means a read operation occurring right after a program operation or an erase operation. That is, the initial read operation is performed by the controller 130 right after performing a program operation or an erase operation on at least one page in any of a plurality of blocks in any plane or die. The controller 130 may read data stored in page(s) in any block except a block on which the program operation or the erase operation has been performed, among the plurality of blocks in any plane or die. In other words, as an initial read operation condition, the program or erase operation needs to be performed before the read operation. In this case, if the initial read operation is performed using the existing default read voltage, a read error may occur because the data has a high number of error bits. A read error occurring when an initial read operation is performed as described above is called a "1$^{st}$ page read issue." In this case, the read error may correspond to a case where the number of fail bits in read data is greater than or equal to a reference number, representing the maximum number of error/fail bits capable of being corrected, through an error correction code (ECC). Accordingly, a read error for the initial read operation may be called an uncorrectable ECC (UECC). According to the present embodiment, in order to reduce the likelihood of a read error for an initial read operation, the controller 130 may first search for an initial read voltage to be applied in an initial read operation, during a background time, that is, the idle time of a memory device, may store the retrieved initial read voltage in a history table, and may perform the initial read operation using the initial read voltage, stored in the history table, when performing the initial read operation in response to a read request received from the host 102 or an internal device. Therefore, not only can the likelihood of a read error be reduced but also the number of read retry operations can be reduced. This is described in detail with reference to FIGS. 4 to 6.

Figure 4:
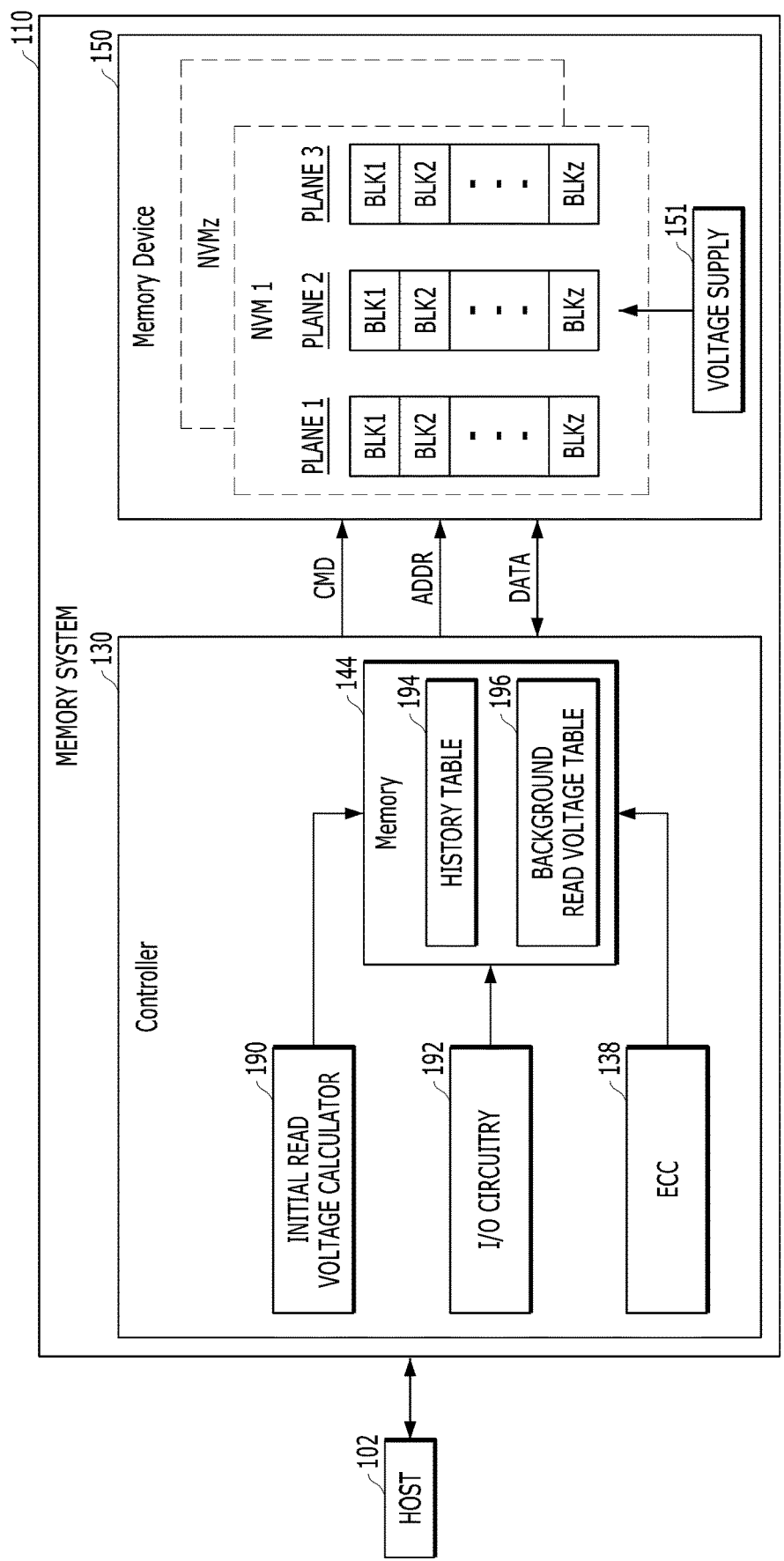
FIG. 4 illustrates a configuration for describing an operation of a memory system, such as that shown in FIG. 1, according to an embodiment.

FIG. 4 illustrates a configuration for describing an operation of the memory system 110 according to an embodiment. FIG. 5 illustrates an example of a history table in which initial read voltages IRV are stored according to an embodiment. FIG. 6 illustrates an example of a background read voltage table including background read voltages BRV to be applied in a background read operation according to an embodiment.

Referring to FIG. 4, the memory system 110 may include the controller 130 and the memory device 150. The controller 130 may include an initial read voltage calculator 190, input/output (I/O) circuitry 192 and the memory 144. The memory device 150 may include a plurality of planes including a plurality of blocks, and a voltage supply 151. For example, the plurality of planes may include a first plane to third plane PLANE1 to PLANE3.

The initial read voltage calculator 190 may previously set an initial read voltage to be applied when an initial read operation is performed by performing a background read operation during the idle time of the memory device. That is, in order to set an initial read voltage for each of the plurality of planes during the idle time of the memory device, the initial read voltage calculator 190 first checks whether the initial read voltage corresponding to each of the plurality of planes has been set in a history table (HT) 194 in the memory 144. Furthermore, the initial read voltage calculator 190 calculates an initial read voltage only for a plane having no initial read voltage in the history table 194. In this case, in order to check whether an initial read voltage for each of the plurality of planes is present, the initial read voltage calculator 190 may check initial read voltages based on flag information stored in the history table 194. For example, the initial read voltage calculator 190 may check whether an initial read voltage corresponding to each of the plurality of planes is present in the history table 194. In the illustrated example of FIG. 5, the history table 194 may include plane information PLANE #, initial read voltage information IRV #, and flag information FLAG. Thus, the history table 194 identifies an initial read voltage and a flag value for each plane. The flag information FLAG may be indicated as "0" or "1." For example, the flag information may be set as "1" with respect to a plane having an initial read voltage. The flag information may be set as "0" with respect to a plane having no initial read voltage. The plane information, initial read voltage information and flag information in the history table 194 are described below. In the illustrated embodiment, plane information PLANE #includes three planes: PLANE 1, PLANE 2 and PLANE 3. A first initial read voltage IRV1 is stored in association with the first plane information PLANE1, and a second initial read voltage IRV2 is stored in association with the second plane information PLANE2. Accordingly, the flag information corresponding to each of PLANE1 and PLANE2 is set and stored as "1." In contrast, PLANE3 has no associated initial read voltage. Accordingly, the flag information for the third plane information PLANE3 is set and stored as "0."

Thus, in the illustrated embodiment, based on the associated flag information, i.e., "0", in the history table 194, the initial read voltage calculator 190 determines that an initial read voltage corresponding to the third plane is not present in the history table 194. Next, in order to calculate an initial read voltage corresponding to the third plane, the initial read voltage calculator 190 checks whether the last operation performed on the third plane was a read operation, that is, whether the last operation performed on the third plane prior to the idle time of the memory device 150 was a program operation or an erase operation. The reason for this is that a program operation or an erase operation, that is, an initial read operation condition, must have been performed in order to perform the background read operation for calculating an initial read voltage for the third plane. Accordingly, the initial read voltage calculator 190 checks whether the condition for the initial read operation is satisfied, before performing the background read operation. That is, if the last operation performed on the third plane prior to the background time is a program operation or an erase operation, the initial read voltage calculator 190 does not need to perform a background program or background erase operation because the condition for the initial read operation is satisfied. In contrast, if the last operation performed on the third plane prior to the background time is a read operation, the initial read voltage calculator 190 needs to perform a first background program operation or a first background erase operation because the condition for the initial read operation is not satisfied. That is, the initial read voltage calculator 190 may perform the background program or background erase operation by issuing a first background program command or a first background erase command for any of a plurality of blocks BLK1 to BLKz in the third plane, for example, the first block BLK1. In this case, z may be a natural number between 1 and n. The initial read voltage calculator 190 may autonomously issue the first background program command or the first background erase command without receiving a program or erase request from the host 102. In this case, when issuing the first background program command, the initial read voltage calculator 190 may issue a command which enables a dummy program to be performed on any free page of an open block in the third plane. Alternatively, when issuing the first background erase command, the initial read voltage calculator 190 may issue a command which enables an erase operation to be performed on any of the plurality of blocks BLK1 to BLKz that includes an invalid page. In this case, the initial read voltage calculator 190 may first perform the first background program operation because, among the first background program and erase operations, the first background erase operation is more effective in terms of overhead.

When the first background program or first background erase operation for the first block BLK1 in the third plane is completed, the initial read voltage calculator 190 may issue a background read command for the second block BLK2 of the plurality of blocks in the third plane. In this case, when issuing the background read command, the initial read voltage calculator 190 may issue an address for any valid page of a plurality of pages in an open block or source block among the plurality of blocks, excluding the first block BLK1.

Next, in order to perform a background read operation, the initial read voltage calculator 190 may select one of a plurality of background read voltages in the background read voltage table 196. Each of the plurality of background read voltages may be set to have a read level which is different from each of the others, where two adjacent background read voltages differ by a given offset. In the illustrated example of FIG. 6, the background read voltage table 196 may include first to third background read voltages BRV1 to BRV3. For example, the initial read voltage calculator 190 may perform a background read operation using the first background read voltage BRV1. Next, the initial read voltage calculator 190 may transmit the address to the memory device 150 along with a background read command, and may transmit the first background read voltage for the second block BLK2 as a control signal.

The initial read voltage calculator 190 may receive, from ECC circuitry 138, the results of the ECC decoding of read data read by the background read operation. Further, the initial read voltage calculator 190 may determine, based on the results, whether the background read operation for the second block BLK2 succeeded. In this case, the ECC circuitry 138 may determine whether the number of error bits detected in the read data exceeds an error correction capability, by performing an ECC decoding operation on the read data received from the memory device 150. That is, if the number of error bits does not exceed the error correction capability or the read data does not include any error bit, the ECC circuitry 138 may determine that the ECC decoding operation has succeeded. In contrast, if the number of error bits exceeds the error correction capability, the ECC circuitry 138 may determine that the ECC decoding operation has failed. The ECC circuitry 138 transmits the results of the ECC decoding for the background read operation.

When receiving, from the ECC circuitry 138, the result indicating that the ECC decoding of the read data has succeeded, the initial read voltage calculator 190 may determine that the background read operation for the second block BLK2 using the first background read voltage has succeeded. Further, the initial read voltage calculator 190 may update the history table 194 by storing the first background read voltage in the history table 194 as an initial read voltage corresponding to a plane including the second block BLK2. For example, the initial read voltage calculator 190 may update the history table 194 by storing the first background read voltage in the history table 194 as the initial read voltage corresponding to the third plane.

In contrast, when receiving, from the ECC circuitry 138, the result indicating that the ECC decoding of the read data has failed, the initial read voltage calculator 190 determines that the background read operation using the first background read voltage has failed. Accordingly, the initial read voltage calculator 190 needs to change from the first background read voltage to the second background read voltage and to perform a background read retry operation using the second background read voltage. In this case, the initial read voltage calculator 190 needs to perform a second background program or second background erase operation in order to satisfy the condition for the initial read operation, before changing the background read voltage and performing the background read retry operation. Furthermore, after the second background program or second background erase operation is completed, the initial read voltage calculator 190 may select the second background read voltage in the background read voltage table 196 and issue a background read retry command for the second block BLK2. Specifically, the initial read voltage calculator 190 may autonomously issue the background read retry command without receiving a background read retry request from the host 102. Furthermore, the controller 130 may issue an address for a read-failed page of the plurality of pages in the second block BLK2. Furthermore, the initial read voltage calculator 190 may transmit the address to the memory device 150 along with the background read retry command, and may transmit the second background read voltage for the second block BLK2 as a control signal.

The initial read voltage calculator 190 may determine whether the background read operation for the second block BLK2 using the second background read voltage succeeds, based on the result of the ECC decoding for the background read retry operation, which has been received from the ECC circuitry 138. When receiving, from the ECC circuitry 138, the result indicating that the decoding operation has succeeded, the initial read voltage calculator 190 may determine that the background read retry operation has succeeded. Furthermore, the initial read voltage calculator 190 may update the history table 194 by storing the second background read voltage in the history table 194 as an initial read voltage corresponding to the plane including the second block BLK2. For example, the initial read voltage calculator 190 may update the history table 194 by storing the second background read voltage in the history table 194 as an initial read voltage corresponding to the third plane. When receiving, from the ECC circuitry 138, the result indicating that the decoding operation has failed, the initial read voltage calculator 190 may determine that the background read retry operation has failed, and perform the background read retry operation again. In this case, the initial read voltage calculator 190 may issue as many background read retry commands for the second block BLK2 as the number of background read voltages in the background read voltage table 196. If a read failure occurs after all of the background read voltages in the background read voltage table 196 have been tried, the initial read voltage calculator 190 may store an initial read voltage, corresponding to a plane including the second block BLK2, as "INVALID." As described above, the initial read voltage calculator 190 may calculate an initial read voltage to be applied in an initial read operation, and may store the calculated initial read voltage in the history table 194 in the memory 144.

The I/O circuitry 192 may receive a read request from the host 102 or an internal device, and may determine whether the received read request is for an initial read operation, right before performing the read operation. In this case, the reason why the initial read operation is checked is to perform the initial read operation using an initial read voltage stored in the history table 194, not a default read voltage, when the initial read operation is performed, because a voltage distribution may have been temporarily shifted due to stress attributable to a program operation or erase operation performed prior to the initial read operation. The number of read retries (represented by a read count) can be reduced by performing the initial read operation using the initial read voltage. Specifically, the I/O circuitry 192 may check, in a mapping table, a physical address corresponding to a logical address in the read request. The I/O circuitry 192 may check a plane, including a block on which the read operation will be performed, based on the checked physical address. In this case, it is assumed that a block corresponding to the physical address is a first block and a plane including the first block is a first plane, by way of example. Furthermore, in order to determine whether the read operation is the initial read operation, the I/O circuitry 192 may determine whether a program operation or an erase operation has been performed on the remaining blocks, except the first block on which the read operation will be performed, among a plurality of blocks in the first plane. If it is determined that the read operation for the first plane is not the initial read operation (NO), the I/O circuitry 192 may perform a normal read operation using the default read voltage. This is described later. In contrast, if it is determined that the read operation for the first plane is the initial read operation (YES), the I/O circuitry 192 may check the history table 194 in order to determine whether an initial read voltage corresponding to the first plane is present. If it is determined that an initial read voltage corresponding to the first plane is not present in the history table 194, the I/O circuitry 192 may set the first background read voltage BRV1, included in the background read voltage table 196, as an initial read voltage corresponding to the first plane, and may perform the initial read operation. In contrast, if it is determined that an initial read voltage corresponding to the first plane is present in the history table 194, the I/O circuitry 192 may perform the initial read operation using the initial read voltage corresponding to the first plane. That is, in order to perform the initial read operation, the I/O circuitry 192 may transmit an address to the memory device 150 along with a read command, and may transmit, as a control signal, the initial read voltage corresponding to the first plane. The I/O circuitry 192 may receive, from the memory device 150, read data read using the initial read voltage, and may store the read data in the memory 144.

When an initial read operation succeeds as a result of the execution of an ECC operation, the I/O circuitry 192 may transmit read data to the host 102. In contrast, when the initial read operation fails as a result of the execution of the ECC operation, the I/O circuitry 192 may perform a normal read operation using a default read voltage. The reason why the normal read operation is performed is that the read operation is not an initial read operation because the initial read operation has been performed once. Accordingly, the I/O circuitry 192 may perform a read operation in response to a read request from the host 102 using a default read voltage set to perform the normal read operation. In this case, the normal read operation may indicate a read operation corresponding to the read request other than the initial read operation. Furthermore, the default read voltage is a reference voltage set to perform the normal read operation, and may be supplied through the voltage supply 151. The I/O circuitry 192 may receive, from the memory device 150, data read using the default read voltage, and may determine whether the normal read operation succeeds. If it is determined that the normal read operation has succeeded (YES), the I/O circuitry 192 may transmit the read data to the host 102. In contrast, if it is determined that the normal read operation has failed (NO), the I/O circuitry 192 may modify the default read voltage and perform a normal read retry operation using the modified read voltage.

The voltage supply 151 in the memory device 150 may supply the default read voltage DRV, a program voltage Vprog, a pass voltage Vpass or an erase voltage Vers to a nonvolatile memory cell in the block BLK. For example, during a read operation for reading data stored in a selected nonvolatile memory cell in any one block BLK, the voltage supply 151 may supply the default read voltage DRV to the selected nonvolatile memory cell. During a program operation for storing data in a selected nonvolatile memory cell in the block BLK, the voltage supply 151 may supply the program voltage Vprog to the selected nonvolatile memory cell. During the read operation or the program operation for the selected nonvolatile memory cell, the voltage supply 151 may supply the pass voltage Vpass to an unselected nonvolatile memory cell. During an erase operation for erasing data stored in a nonvolatile memory cell in the block BLK, the voltage supply 151 may supply the erase voltage Vers to the block BLK.

Figure 7:
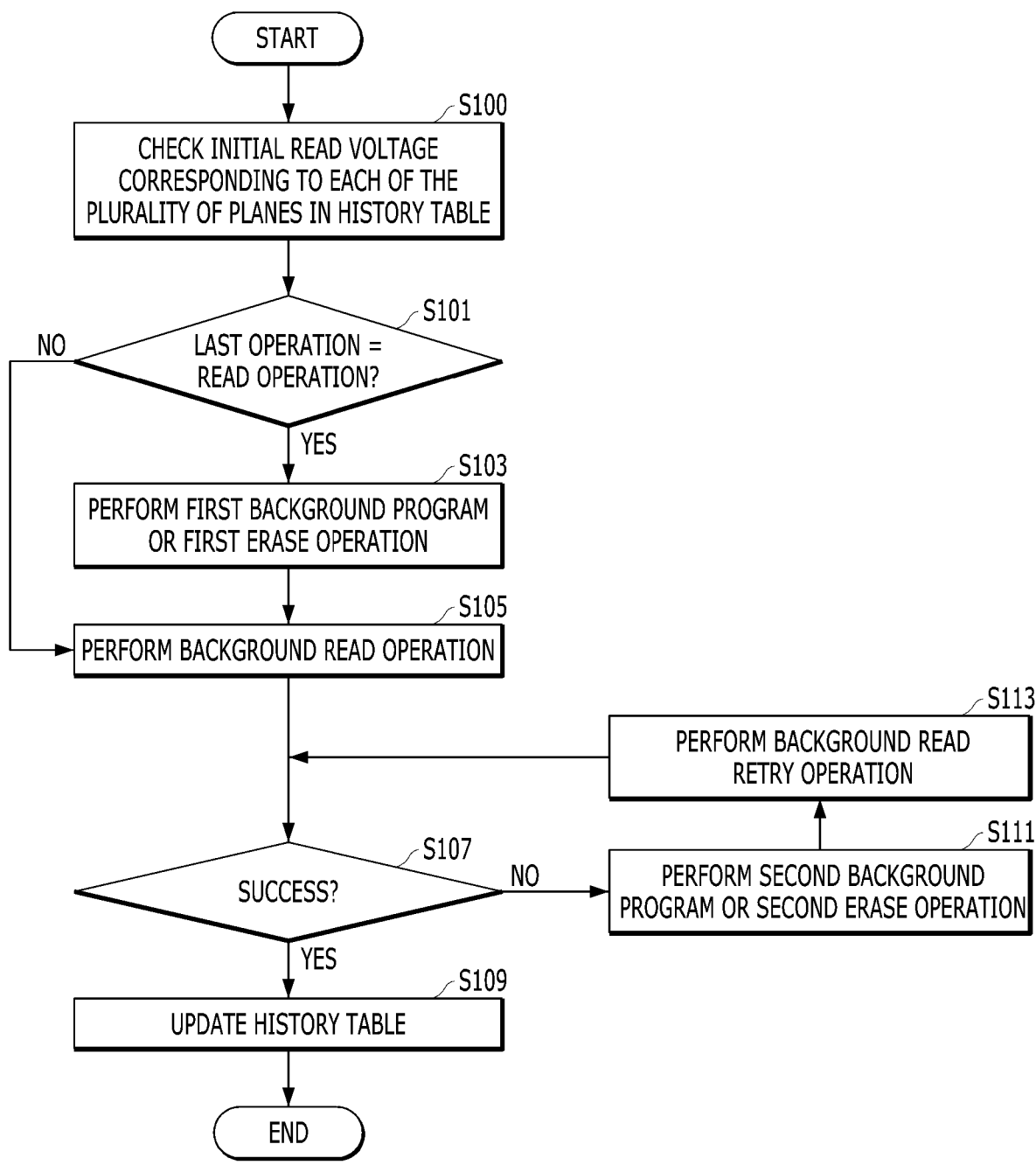
FIG. 7 is a flowchart illustrating an operating method of the memory system for setting an initial read voltage according to an embodiment.

FIG. 7 is a flowchart illustrating an operating method of the memory system for setting an initial read voltage according to an embodiment. Specifically, FIG. 7 describes a method of previously setting, by the controller 130, an initial read voltage to be applied when performing an initial read operation by performing a background read operation during the idle time of the memory device 150, that is, during the background time. Prior to the operation described in FIG. 7, an initial read voltage may be managed in association with each of a plurality of dies or a plurality of planes. A method of setting an initial read voltage corresponding to each of a plurality of planes is described, by way of example.

Referring to FIG. 7, at step S100, in order to set an initial read voltage corresponding to each of a plurality of planes during the idle time of the memory device, the controller 130 may check whether an initial read voltage corresponding to each of the plurality of planes has been set in the history table HT 194 in the memory 144. Further, the controller 130 may calculate and set an initial read voltage with respect to a plane for which the initial read voltage has not been set. In this case, in order to check whether the initial read voltage corresponding to each of the plurality of planes is present, the controller 130 may check flag information stored in the history table 194. If the initial read voltage corresponding to each of the plurality of planes has been set in the history table 194, the controller 130 may not perform an operation for setting the initial read voltage. A method of calculating, by the controller 130, an initial read voltage to be applied when performing an initial read operation is described below with reference to steps S101, S103, S105, S107, S109, S111 and S113.

At step S101, the controller 130 may check whether the last operation, which is performed prior to a background read operation for setting an initial read voltage for a plane for which the initial read voltage has not been set, is a read operation. In this case, the background read operation may indicate a read operation that first occurs after a background program/erase operation or a normal program/erase operation is performed. In other words, as a condition for performing the background read operation, the background program/erase operation or the normal program/erase operation needs to be performed prior to the background read operation. Specifically, if it is determined that the last operation is a read operation, the controller 130 needs to perform a background program or background erase operation on any one of a plurality of blocks in order to randomly set a condition for a background read operation. In contrast, if it is determined that the last operation is a program operation or an erase operation, the controller 130 may immediately perform a background read operation because a condition for an initial read operation is satisfied. Accordingly, the controller 130 may check whether the condition for the initial read operation is satisfied, by checking whether the last operation is a read operation. Accordingly, the controller 130 may determine whether the last operation, which is performed prior to a background read operation for setting an initial read voltage, is a read operation.

If it is determined that the last operation performed on the plane is not a read operation (S101, NO), the controller 130 may perform step S105.

In contrast, if it is determined that the last operation performed on the plane is a read operation (S101, YES), at step S103, the controller 130 may issue a first background program command or a first background erase command for a first block BLK1 of the plurality of blocks in the plane, may perform a first background program operation or a first background erase operation, and may then perform step S105. In this case, the controller 130 may first perform the first background program operation because, among the first background program and erase operations, the first background program operation is more effective in terms of overhead.

At step S105, the controller 130 may issue a background read command for a second block BLK2 among the plurality of blocks except the first block BLK1, and may perform a background read operation using a first background read voltage. In this case, when issuing the background read command, the controller 130 may issue an address for any one valid page of a plurality of pages in an open block or source block among the plurality of blocks except the first block BLK1. Furthermore, the controller 130 may select a first background read voltage, which is included in the background read voltage table 196, as a background read voltage for the second block BLK2. The background read voltage table may include a plurality of randomly set read voltages. The controller 130 may transmit the background read command to the memory device 150. In this case, the controller 130 may transmit the address to the memory device 150 along with the background read command, and may transmit the background read voltage for the second block BLK2 as a control signal.

At step S107, the controller 130 may determine whether the background read operation for the second block BLK2 succeeded. Specifically, the controller 130 may perform an ECC operation on data received from the memory device 150, and may determine whether the number of error bits detected in the received data exceeds an error correction capability. If it is determined that the number of error bits does not exceed the error correction capability or the read data do not include an error bit (S107, YES), the controller 130 may determine that the background read operation has succeeded and perform step S109. At step S109, the controller 130 may update the history table 194 by storing the first background read voltage in the history table 194 as an initial read voltage corresponding to a plane including a corresponding block.

In contrast, if it is determined that the number of error bits exceeds the error correction capability, the controller 130 may determine that the background read operation has failed (S107, NO) and perform step S111. At step S111, the controller 130 may perform a second background program operation or a second background erase operation in order to satisfy the condition for an initial read operation. Furthermore, after completely performing the second background program operation or the second background erase operation, the controller 130 may perform step S113.

At step S113, the controller 130 may change from the first background read voltage to a second background read voltage in the background read voltage table, and may issue a background read retry command for the second block BLK2. Specifically, the controller 130 may autonomously issue the background read retry command without receiving a background read retry request from the host 102. Furthermore, the controller 130 may issue an address for a read-failed page among a plurality of pages in the second block BLK2, and may change a background read voltage for the second block BLK2 from the first background read voltage to the second background read voltage. Furthermore, the controller 130 may transmit the background read retry command to the memory device 150. In this case, the controller 130 may transmit the address to the memory device 150 along with the background read retry command, and may transmit a read retry voltage for the second block BLK2 as a control signal.

At step S107, the controller 130 may receive data from the memory device 150 by performing a background read retry operation using the second background read voltage in response to the background read retry command, and may determine whether the background read operation for the second block BLK2 succeeded. Specifically, the controller 130 may perform an ECC operation on the data received from the memory device 150, and may determine whether the number of error bits detected in the received data exceeds an error correction capability. If it is determined that the number of error bits does not exceed the error correction capability or the read data do not include an error bit, the controller 130 may determine that the background read retry operation has succeeded, and may perform step S109. At step S109, the controller 130 may set the second background read voltage as an initial read voltage corresponding to a plane including the second block BLK2, and may update the history table by storing the initial read voltage in the history table.

In contrast, if it is determined that the number of error bits exceeds the error correction capability, the controller 130 may determine that the background read retry operation has failed (NO at step S107) and perform step S111. In this case, when performing the background read retry operation again, the controller 130 may issue as many background read retry commands for the second block BLK2 as the number of background read voltages in the background read voltage table 196. If a read failure occurs even after all background read voltages in the background read voltage table 196 have been tried, the controller 130 may store an initial read voltage, corresponding to a plane including the second block BLK2, as "INVALID."

Figure 8:
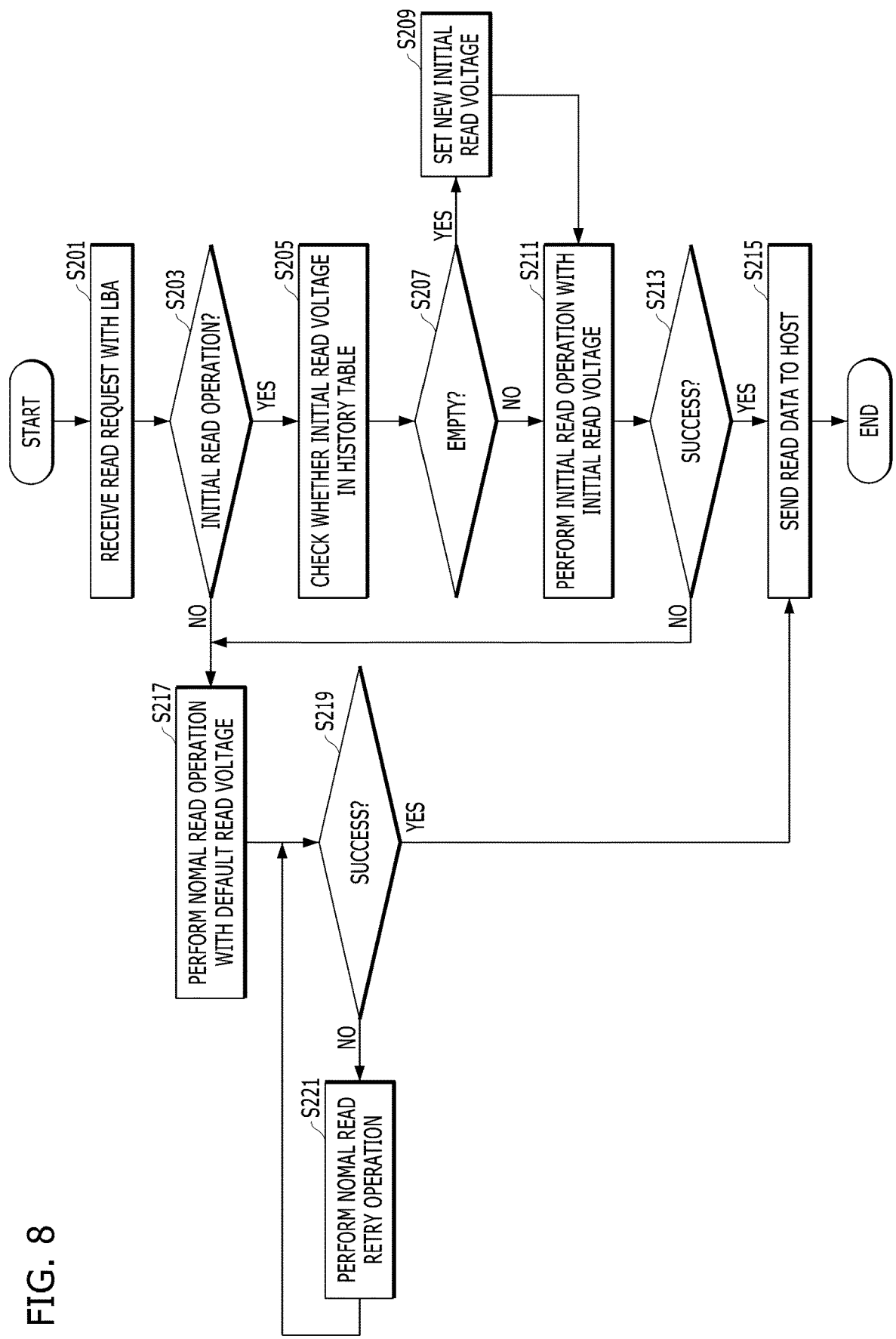
FIG. 8 is a flowchart for illustrating an operating method of the memory system that performs a read operation according to an embodiment.

FIG. 8 is a flowchart illustrating an operating method of the memory system that performs a read operation according to an embodiment.

Referring to FIG. 8, at step S201, the controller 130 may receive a read request and a logical address or a logical block address (LBA) from the host 102.

At step S203, the controller 130 may determine whether the read request received from the host 102 is an initial read request, i.e., a request for an initial read operation. In this case, the initial read request may indicate a read request received from the host with respect to any one of a plurality of blocks in the same plane or the same die, except a block on which a program or erase operation has been performed, right after performing the program or erase operation on any one of the plurality of blocks. In this case, the reason why the initial read request is checked is to use an initial read voltage to be applied when an initial read request is received because a voltage distribution may have been temporarily shifted due to stress attributable to a program operation or an erase operation performed prior to the initial read request. In order to perform an initial read operation in response to the initial read request, the controller 130 may use initial read voltages that correspond to a plurality of respective planes and that are stored in the history table through the process of FIG. 7. The number of read retries may be reduced by performing the initial read operation using the initial read voltage stored in the history table.

Specifically, the controller 130 may check, in a mapping table, a physical address corresponding to the logical address received from the host 102. The controller 130 may check an N-th plane, including a j-th block on which a read operation will be performed, based on the physical address identified in the mapping table. Furthermore, the controller 130 may determine whether the read request is an initial read request, by checking whether a program operation or an erase operation has been performed on the remaining blocks, except a block on which the read request will be performed, among a plurality of blocks in the N-th plane.

If it is determined that the read request received from the host 102 is not an initial read request (S203, NO), the controller 130 may perform step S217, which is described below.

In contrast, if it is determined that the read request received from the host 102 is an initial read request (S203, YES), at step S205 and step 207, the controller 130 may check the history table 194 in order to determine whether an initial read voltage corresponding to the N-th plane is present in the history table 194. If it is determined that an initial read voltage corresponding to the N-th plane is present in the history table 194 (S207, NO), the controller 130 may perform step S211. In contrast, if it is determined that an initial read voltage corresponding to the N-th plane is not present in the history table 194 (S207, YES), at step S209, the controller 130 may set a first background read voltage in the background read voltage table 196 as an initial read voltage corresponding to the N-th plane, and may perform step S211.

At step S211, the controller 130 may perform an initial read operation using the initial read voltage corresponding to the N-th plane. That is, in order to perform the initial read request received from the host 102, the controller 130 transmits an initial read command to the memory device 150. In this case, the controller 130 may transmit the address to the memory device 150 along with the initial read command, and may transmit the initial read voltage corresponding to the N-th plane as a control signal.

At step S213, the controller 130 may receive, from the memory device 150, data read using the initial read voltage, and may determine whether the initial read operation succeeded. Specifically, the controller 130 may perform an ECC operation on the data received from the memory device 150, and may determine whether the number of error bits detected in the received data exceeds an error correction capability. If it is determined that the number of error bits does not exceed the error correction capability or the data do not include any error bits, the controller 130 may determine that the initial read operation has succeeded (S213, YES), and may perform step S215. At step S215, the controller 130 may transmit the data to the host 102.

In contrast, if it is determined that the number of error bits exceeds the error correction capability, the controller 130 may determine that the initial read operation has failed (S213, NO), and may perform a normal read operation at step S217. The reason why the normal read operation is performed is that a condition for the initial read operation is not satisfied because the read operation has been performed once at step S211. Accordingly, the controller 130 may perform a read operation using a default read voltage, which is set to perform the normal read operation, in response to the read request from the host. In this case, the normal read operation may indicate a read operation, corresponding to the read request received from the host, other than the initial read operation. Furthermore, the default read voltage may indicate a reference voltage set to perform the normal read operation.

At step S219, the controller 130 may receive, from the memory device 150, data read using the default read voltage, and may determine whether the normal read operation succeeds. If it is determined that the normal read operation has succeeded (S213, YES), the controller 130 may perform step S215. In contrast, if it is determined that the normal read operation has failed (S213, NO), the controller 130 may modify the default read voltage, may perform a normal read retry operation using the modified read voltage, and may perform step S219 again.

As described above, embodiments provide a memory system for previously setting, during the idle time of a memory device, an initial read voltage to be applied to a memory cell upon execution of an initial read operation occurring right after a program operation or an erase operation, and an operating method of the memory system.

According to embodiments, if a read pass occurs after a background read operation is performed using a background read voltage right after a program or erase operation is performed during the idle time of a memory device, the background read voltage is set as an initial read voltage which may be used for a read operation performed by an external or internal device. Accordingly, read performance may be improved by reducing the number of read retries to successfully address an increase in the read failure of a first read operation occurring right after a program or erase operation is performed.

These effects, as well as other effects understood by those skilled in the art to which the present disclosure pertains from the present disclosure, may be obtained through embodiments of the present disclosure.

Although various embodiments have been illustrated and described, it will be apparent to those skilled in the art that various changes and modifications may be made without departing from the spirit and scope of the invention as defined in the following claims. The present invention encompasses all such changes and modifications that fall within the scope of the claims.

What is claimed is:

1. A memory system comprising:
 a memory device comprising a plurality of nonvolatile memories, each comprising a plurality of blocks; and
 a controller configured to control the memory device and a memory including a history table of multiple initial read voltages and a background read voltage table,
 wherein the controller:
 determines a new initial read voltage by performing a background read operation on a nonvolatile memory for which an initial read voltage is not set, among the plurality of nonvolatile memories, during an idle time of the memory device, and stores the new initial read voltage in the history table; and
 selects, in the history table, an initial read voltage corresponding to a nonvolatile memory on which an initial read operation is to be performed if a read operation is the initial read operation, when performing the read operation in response to a read request received from a host, and performs the initial read operation on the nonvolatile memory using the selected initial read voltage,
 wherein the controller checks whether a last operation, performed on the nonvolatile memory for which the initial read voltage has not been set, is a read operation.

2. The memory system of claim 1, wherein:
 the initial read operation indicates a read operation occurring right after a program operation or an erase operation performed on one of the plurality of blocks in one of the nonvolatile memories, and
 the read operation is performed on a block different from the block on which the program operation or the erase operation has been performed among the plurality of blocks.

3. The memory system of claim 1, wherein, when the last operation performed on the nonvolatile memory for which the initial read voltage has not been set is a read operation, the controller performs a first background program operation or a first background erase operation on one of the plurality of blocks in the nonvolatile memory.

4. The memory system of claim 1, wherein, when the last operation performed on the nonvolatile memory for which the initial read voltage has not been set is not a read operation, the controller performs the background read operation on a block different from a block on which a program operation or an erase operation is performed among the plurality of blocks in the nonvolatile memory.

5. The memory system of claim 1, wherein the controller selects one of a plurality of background read voltages stored in the background read voltage table in the memory, performs the background read operation, sets the selected background read voltage as an initial read voltage corresponding to the nonvolatile memory when the background read operation succeeds, and stores the initial read voltage in the history table.

6. The memory system of claim 5, wherein, when the background read operation fails, the controller performs a second background program operation or a second background erase operation on the nonvolatile memory, changes the background read voltage, and performs a background read retry operation on the nonvolatile memory.

7. The memory system of claim 6, wherein, when the background read retry operation succeeds, the controller sets the changed background read voltage as an initial read voltage corresponding to the nonvolatile memory and stores the initial read voltage in the history table.

8. The memory system of claim 5, wherein:
 the plurality of background read voltages in the background read voltage table are randomly set in order to perform the background read operation, and
 the plurality of background read voltages are read voltages, adjacent ones of which are shifted by a given offset, based on a default read voltage applied when a read operation corresponding to the read request from the host is not an initial read operation.

9. The memory system of claim 1, wherein, when performing an initial read operation in response to the read request from the host, when an initial read voltage corresponding to the nonvolatile memory on which the initial read operation is to be performed is not present in the history table, the controller performs the initial read operation using one of the plurality of background read voltages in the background read voltage table.

10. The memory system of claim 1, wherein, when an initial read operation fails as a result of the initial read operation performed in response to the read request from the host, the controller determines, as a normal read request, the read request received from the host because the read operation has been performed once, and performs a normal read operation using a default read voltage.

11. The memory system of claim 1, wherein, when a read operation to be performed in response to the read request from the host is not an initial read operation, the controller performs a normal read operation using a default read voltage in response to the read request.

12. The memory system of claim 1, wherein each of the plurality of nonvolatile memories comprises a plurality of dies or a plurality of planes.

13. An operating method of a memory system, that comprises a memory device comprising a plurality of nonvolatile memories each comprising a plurality of blocks, and a controller for controlling the memory device and a memory comprising a history table and a background read voltage table, the operating method comprising:
 selecting one of a plurality of background read voltages in a background read voltage table, with respect to a nonvolatile memory for which the initial read voltage has not been set, among the plurality of nonvolatile memories, during an idle time of the memory device, and performing a background read operation on the nonvolatile memory using the selected background read voltage;

setting the selected background read voltage as an initial read voltage corresponding to the nonvolatile memory when the background read operation succeeds and storing the initial read voltage in the history table; and checking, by the controller, whether a last operation performed on the nonvolatile memory for which the initial read voltage has not been set is a read operation.

14. The method of claim 13, wherein:
the initial read operation includes a read operation occurring right after a program operation or an erase operation performed on one of the plurality of blocks in one of the nonvolatile memories, and the read operation is performed on a block different from the block on which the program operation or the erase operation has been performed among the plurality of blocks.

15. The method of claim 13, further comprising: when the last operation performed on the nonvolatile memory for which the initial read voltage has not been set is a read operation, performing, by the controller, a first background program operation or a first background erase operation on one of the plurality of blocks in the nonvolatile memory.

16. The method of claim 13, further comprising: when the last operation performed on the nonvolatile memory for which the initial read voltage has not been set is not a read operation, performing, by the controller, a background read operation on a block different from a block on which a program operation or an erase operation has been performed among the plurality of blocks in the nonvolatile memory.

17. The method of claim 13, further comprising: selecting, by the controller, one of a plurality of background read voltages stored in the background read voltage table in the memory, performing the background read operation, setting the selected background read voltage as an initial read voltage corresponding to the nonvolatile memory when the background read operation succeeds, and storing the initial read voltage in the history table.

18. The method of claim 17, further comprising: when the background read operation fails, performing, by the controller, a second background program operation or a second background erase operation on the nonvolatile memory, changing the background read voltage, and performing a background read retry operation on the nonvolatile memory.

19. The method of claim 18, further comprising: when the background read retry operation succeeds, setting, by the controller, the changed background read voltage as an initial read voltage corresponding to the nonvolatile memory and storing the initial read voltage in the history table.

20. The method of claim 17, wherein:
the plurality of background read voltages in the background read voltage table are randomly set to perform the background read operation, and are read voltages, adjacent ones of which are shifted by a given offset, based on a default read voltage applied when a read operation corresponding to the read request from the host is not an initial read operation, and are set as different read voltages.

21. An operating method of a memory system comprising a memory device comprising a plurality of nonvolatile memories and a controller for controlling the memory device, the operating method comprising:
receiving a read request and an address from a host;
checking whether a read operation is an initial read operation, by checking a nonvolatile memory on which the read operation is to be performed in response to the read request based on the address;
identifying a history table to determine whether an initial read voltage corresponding to the nonvolatile memory has been stored in the history table, if the read operation is the initial read operation;
performing the initial read operation on the nonvolatile memory using the initial read voltage if the initial read voltage corresponding to the nonvolatile memory is present in the history table; and
checking, by the controller, whether a last operation performed on the nonvolatile memory for which the initial read voltage has not been set is a read operation.

22. The operating method of claim 21, further comprising performing the initial read operation on the nonvolatile memory using one of a plurality of background read voltages stored in a background read voltage table when an initial read voltage corresponding to the nonvolatile memory is not present in the history table.

23. The operating method of claim 21, wherein the checking comprises performing a normal read operation using a default read voltage, which is set to be applied to a normal read request, in response to the read request if the read operation is not an initial read operation.

24. The operating method of claim 21, wherein the performing comprises:
determining, as a normal read request, the read request received from the host because the read operation has been performed once, when the initial read operation performed on the nonvolatile memory fails; and
performing a normal read operation using a default read voltage set to be applied to the normal read request.

25. The operating method of claim 21, wherein each of the plurality of nonvolatile memories comprises a plurality of dies or a plurality of planes.

26. A memory system comprising:
a memory device including a plurality of nonvolatile memories, each nonvolatile memory including a plurality of blocks; and
a controller configured to:
perform a background read operation on a select nonvolatile memory among the plurality of nonvolatile memories using an initial read voltage;
store the initial read voltage, as a history read voltage, in a history table;
select the history read voltage from the history table in response to a read request from a host;
perform an initial read operation on the select nonvolatile memory using the history read voltage; and
checking, by the controller, whether a last operation performed on the select nonvolatile memory for which the initial read voltage has not been set is a read operation.

* * * * *